United States Patent
Lee et al.

(10) Patent No.: US 10,636,874 B2
(45) Date of Patent: Apr. 28, 2020

(54) EXTERNAL RESISTANCE REDUCTION WITH EMBEDDED BOTTOM SOURCE/DRAIN FOR VERTICAL TRANSPORT FET

(71) Applicant: INTERNATIONAL BUSINESS MACHINES CORPORATION, Armonk, NY (US)

(72) Inventors: Choonghyun Lee, Rensselaer, NY (US); Reinaldo Vega, Mahopac, NY (US); Jingyun Zhang, Albany, NY (US); Miaomiao Wang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/116,012

(22) Filed: Aug. 29, 2018

(65) Prior Publication Data

US 2020/0075723 A1    Mar. 5, 2020

(51) Int. Cl.

| | |
|---|---|
| *H01L 29/76* | (2006.01) |
| *H01L 29/66* | (2006.01) |
| *H01L 21/02* | (2006.01) |
| *H01L 21/768* | (2006.01) |
| *H01L 29/08* | (2006.01) |
| *H01L 29/78* | (2006.01) |
| *H01L 29/49* | (2006.01) |
| *H01L 29/51* | (2006.01) |
| *H01L 21/28* | (2006.01) |

(52) U.S. Cl.
CPC .... *H01L 29/0847* (2013.01); *H01L 21/28088* (2013.01); *H01L 29/4966* (2013.01); *H01L 29/517* (2013.01); *H01L 29/66553* (2013.01); *H01L 29/66666* (2013.01); *H01L 29/7827* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 9,287,362 B1 | 3/2016 | Basu et al. | |
| 9,570,357 B2 | 2/2017 | Anderson et al. | |
| 9,721,845 B1 | 8/2017 | Cheng et al. | |
| 9,761,728 B1 | 9/2017 | Cheng et al. | |
| 9,799,765 B1 | 10/2017 | Bergendahl et al. | |
| 9,859,166 B1 * | 1/2018 | Cheng | H01L 21/823487 |
| 9,935,195 B1 | 4/2018 | Xu et al. | |

(Continued)

*Primary Examiner* — Robert K Carpenter
(74) *Attorney, Agent, or Firm* — Tutunjian & Bitetto, P.C.; L. Jeffrey Kelly

(57) ABSTRACT

A method is presented for reducing external resistance of a vertical field-effect-transistor (FET). The method includes forming a plurality of fins over a sacrificial layer disposed over a substrate, selectively removing the sacrificial layer to form an etch stop layer in direct contact with the substrate, disposing embedded bottom source/drain regions between a bottom portion of the plurality of fins and the etch stop layer, disposing encapsulation layers over the plurality of fins, recessing at least one of the encapsulation layers to expose top portions of the plurality of fins, forming top spacers adjacent the top portions of the plurality of fins, and forming top source/drain regions over the top portions of the plurality of fins.

17 Claims, 7 Drawing Sheets

(56) References Cited

U.S. PATENT DOCUMENTS

| | | |
|---|---|---|
| 9,954,102 B1 | 4/2018 | Mochizuki et al. |
| 9,960,272 B1 * | 5/2018 | Bao et al. |
| 10,050,125 B1 * | 8/2018 | Qi .................... H01L 29/66666 |
| 2017/0358497 A1 | 12/2017 | Cheng et al. |
| 2018/0068857 A1 | 3/2018 | Adusumilli et al. |

* cited by examiner

EXTERNAL RESISTANCE REDUCTION WITH EMBEDDED BOTTOM SOURCE/DRAIN FOR VERTICAL TRANSPORT FET

BACKGROUND

Technical Field

The present invention relates generally to semiconductor devices, and more specifically, to external resistance reduction by employing embedded bottom source/drain regions for vertical transport field-effect-transistors (FETs).

Description of the Related Art

Vertical Transport FETs (VTFETs) are a promising alternative to standard lateral FET structures due to potential benefits, among others, in terms of reduced circuit footprint. In this type of structure, the current flow is perpendicular to a supporting wafer, unlike the lateral current flow in lateral FETs. A logic circuit comprising VTFETs can be referred to as a "vertical transport logic gate." VTFETs can potentially provide electronic devices comprising logic circuits with improved circuit density.

SUMMARY

In accordance with an embodiment, a method is provided for reducing external resistance. The method includes forming a plurality of fins over a sacrificial layer formed over a substrate, selectively removing the sacrificial layer to form an etch stop layer in direct contact with the substrate, disposing embedded bottom source/drain regions between a bottom portion of the plurality of fins and the etch stop layer, disposing encapsulation layers over the plurality of fins, recessing at least one of the encapsulation layers to expose top portions of the plurality of fins, forming top spacers adjacent the top portions of the plurality of fins, and forming top source/drain regions over the top portions of the plurality of fins.

In accordance with another embodiment, a method is provided for reducing external resistance. The method includes forming a plurality of fins over a sacrificial layer formed over a substrate, selectively removing the sacrificial layer such that an upper half of the plurality of fins are processed separately from a lower half of the plurality of fins, and disposing embedded bottom source/drain regions between a bottom portion of the plurality of fins and the etch stop layer.

In accordance with yet another embodiment, a semiconductor structure is provided for reducing external resistance. The semiconductor structure includes an etch stop layer formed over a substrate, embedded bottom source/drain regions disposed in direct contact with the etch stop layer, a plurality of fins disposed over the embedded bottom source/drain regions, a high-k layer and a work function metal layer disposed adjacent the plurality of fins, top spacers disposed adjacent top portions of the plurality of fins, and top source/drain regions disposed over the top portions of the plurality of fins.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
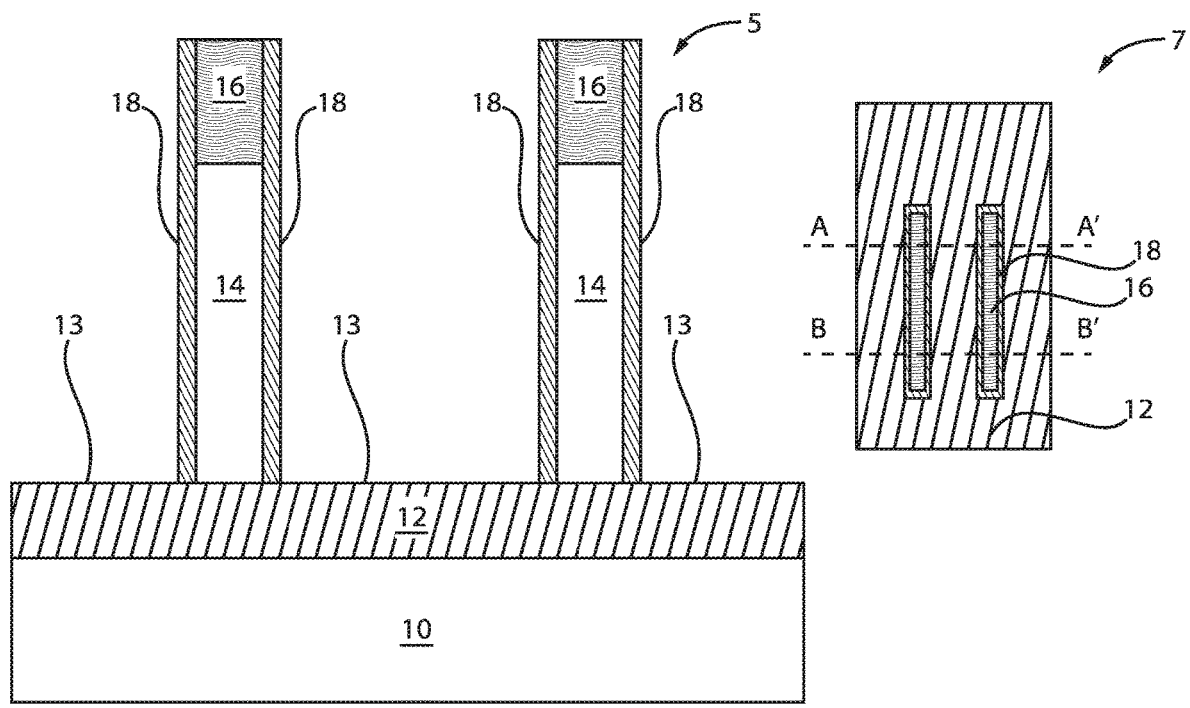
FIG. 1 is a cross-sectional view of a semiconductor structure including a plurality of fins formed over a semiconductor substrate, in accordance with an embodiment of the present invention.

Embodiments in accordance with the present invention provide methods and devices for forming vertical field effect transistor (FET) devices with reduced contact resistance. Vertical FET devices employ doped source and drain regions, where a doped source/drain (S/D) region for a vertical FET can be formed on top of a vertical semiconductor fin, and where a doped S/D region can be formed underneath the vertical semiconductor fin. In addition, a vertical S/D contact of the vertical FET device can be disposed adjacent to the vertical semiconductor fin as an elongated bar contact. The vertical S/D contact can be formed to make contact to an upper surface of the underlying S/D region, and can be disposed at a sufficient distance from the vertical semiconductor fin so that the vertical S/D contact does not electrically short to the vertical metal gate structure formed on the vertical semiconductor fin. What this effectively means is that the current path through the doped S/D region between a vertical contact/S/D region interface and a S/D/channel junction interface, can be constructed entirely of doped semiconductor material. This current path through the doped S/D region, if relatively long, can result in increased series resistance of the S/D, which in turn reduces a total drive current of the vertical FET device.

Thus, contact resistance dominates as transistor device scaling continues beyond the 10 nanometer (nm) technology node. The term contact resistance is the contribution to the total resistance of a material in which total resistance comes from the electrical leads and connections, as opposed to the intrinsic resistance that is an inherent property independent of the measurement method. Contact resistivity (RhoC) reduction alone is not enough to reduce external resistance to the target for the 10 nm technology node and beyond, and a new contact structure is needed to increase contact area.

Embodiments in accordance with the present invention provide methods and devices employing techniques for fabricating or constructing self-aligned highly doped bottom epi in vertical FET structures to increase contact area, and, thus, reduce contact resistance. The exemplary embodiments provide a self-aligned bottom epi formation for achieving low resistance at the fin bottom without any thermal budget limitation. Stated differently, the exemplary embodiments provide a uniform embedded bottom source/drain epi with self-aligned reactive ion etch and an etch stop layer. The exemplary methods can be manufactured using 10 nm technology and beyond.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a plurality of fins formed over a semiconductor substrate, in accordance with an embodiment of the present invention.

The semiconductor structure 5 includes a substrate 10, a sacrificial layer 12 formed over the substrate 10, and a plurality of fins 14 formed over the sacrificial layer 12. Each fin 14 includes a hardmask 16 on a top surface thereof, as well as dielectric liners 18 formed on sidewalls thereof.

The substrate 10 can be crystalline, semi-crystalline, microcrystalline, or amorphous. The substrate 10 can be essentially (e.g., except for contaminants) a single element (e.g., silicon), primarily (e.g., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials.

The sacrificial layer 12 can be a silicon germanium (SiGe) layer having a top surface 13. A number of different sources can be used for the epitaxial growth of SiGe sacrificial layers. In some embodiments, a gas source for the deposition of epitaxial semiconductor material includes a silicon containing gas source, a germanium containing gas source, or a combination thereof. The epitaxial germanium layer 12 can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be employed.

The plurality of fins 14 can be formed from a semiconductor material including, but not limited to Si, strained Si, SiC, SiGe, SiGeC, Si alloys, Ge, Ge alloys, GaAs, InAs, InP, as well as other III/V and II/VI compound semiconductors. The plurality of fins 14 can be etched by employing, e.g., a reactive ion etch (RIE) or the like. In other embodiments, the etching can include a dry etching process such as, for example, reactive ion etching, plasma etching, ion etching or laser ablation. The etching can further include a wet chemical etching process in which one or more chemical etchants are employed to remove portions of the layers.

The plurality of fins 14 can be, e.g., silicon (Si) fins. In another exemplary embodiment, the plurality of fins 14 can be, e.g., silicon germanium (SiGe) fins. Yet in another exemplary embodiment, some of fins 14 can be a material that is different from the other fins. For example, some fins can be silicon fins while others can be silicon germanium (SiGe) fins. One skilled in the art can contemplate forming fins 14 from any type of materials.

The hardmask 16 can be manufactured of silicon nitride (SiN), deposited using, for example, low pressure chemical vapor deposition (LPCVD). In other example embodiments, the hardmask 16 can include, but is not limited to, hafnium oxide (HfO$_2$) or tantalum nitride (TaN) or titanium nitride (TiN). In some embodiments, the hardmask 16 can include multiple layers, for example, silicon nitride on top of silicon oxide. In some embodiments, the vertical thickness of the hardmask 16 ranges from about 30 nm to about 150 nm. The hardmask 16 can be formed by any suitable patterning technique, including but not limited to, sidewall image transfer (SIT), self-aligned double patterning (SADP), self-aligned quadruple patterning (SAQP), lithography followed by etching, etc.

Spacers or liners 18 are shown formed adjacent the plurality of fins 14. The spacers or liners 18 can be formed by first providing a spacer material and then etching the spacer material. The spacer material can include any dielectric spacer material including, for example, a dielectric oxide, dielectric nitride, and/or dielectric oxynitride. In one example, the spacer material can include silicon oxide or silicon nitride (SiN). The spacer material can be provided by a deposition process including, for example, chemical vapor deposition (CVD), plasma enhanced chemical vapor deposition (PECVD), or physical vapor deposition (PVD). The etching of the spacer material can include a dry etch process such as, for example, a reactive ion etch (RIE). In some embodiments, the liners 18 have a thickness within the range of about 2-10 nm.

Moreover, top view 7 of structure 5 is illustrated. The top view 7 depicts the plurality of fins 14. In particular, the top view 7 shows the hardmask 16 of the fins 14 encompassed by the liners 18. Additionally, the sacrificial SiGe layer 12 is shown. A first axis A-A' extends through an upper half of the fins 14, whereas a second axis B-B' extends through a lower half of the fins 14.

Figure 2:
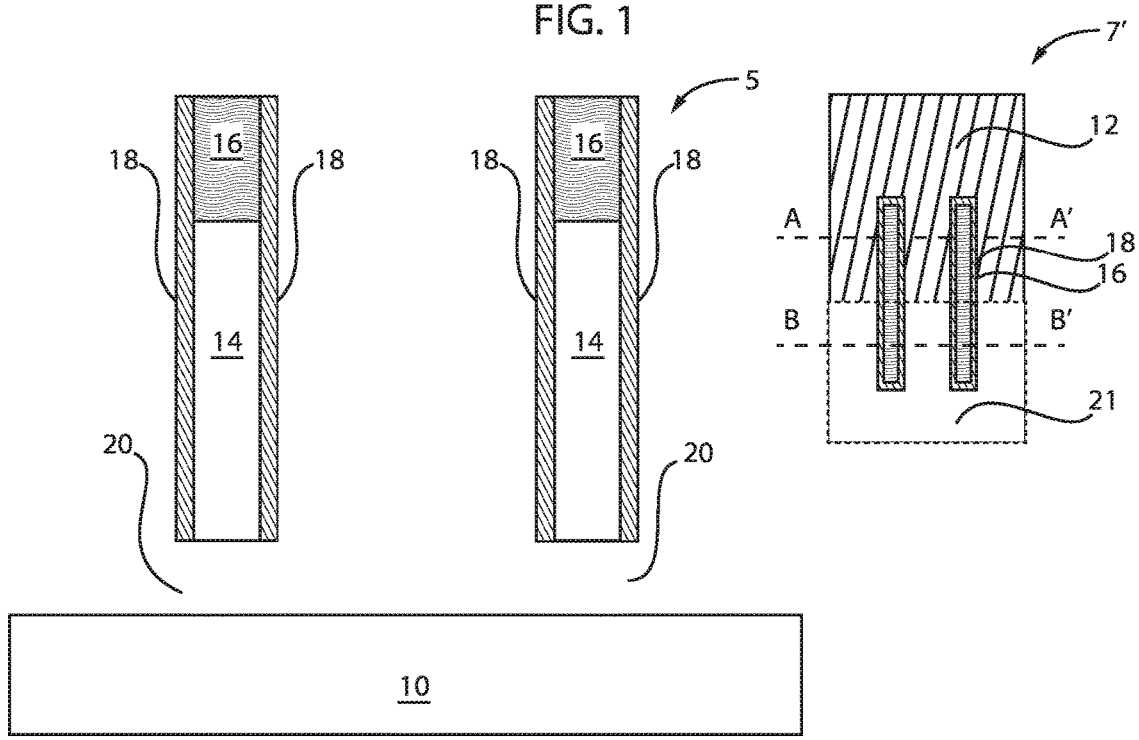
FIG. 2 is a cross-sectional view of the semiconductor structure of FIG. 1 where an upper half of a sacrificial layer is removed, in accordance with an embodiment of the present invention.

FIG. 2 is a cross-sectional view of the semiconductor structure of FIG. 1 where an upper half of a sacrificial layer is removed, in accordance with an embodiment of the present invention.

In various exemplary embodiments, an upper half of the sacrificial layer 12 is removed to form or define a gap region 20. The sacrificial layer can be, e.g., a silicon germanium (SiGe) layer. The etch stops on the substrate 10. In one example, a vertical wet etch can be employed to remove the sacrificial layer 12. Non-limiting examples of wet etch processes that can be used to form the recess include potassium hydroxide (KOH), ammonium hydroxide (ammonia), tetramethylammonium hydroxide (TMAH), hydrazine, or ethylene diamine pyrocatechol (EDP), or any combination thereof.

Figure 3:
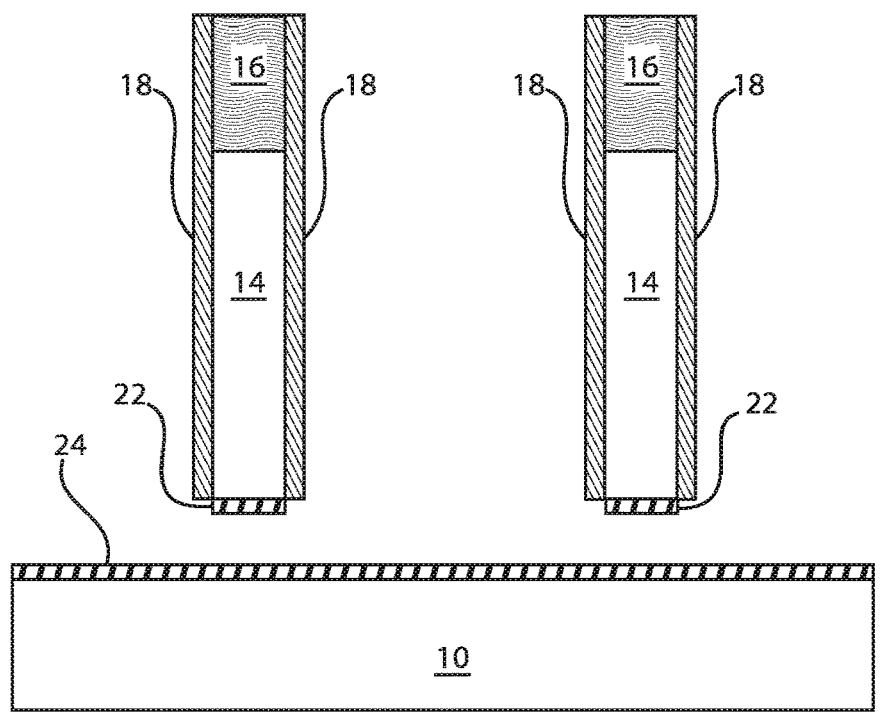
FIG. 3 is a cross-sectional view of the semiconductor structure of FIG. 2 where an etch stop layer is grown, in accordance with an embodiment of the present invention.
Figure 4:
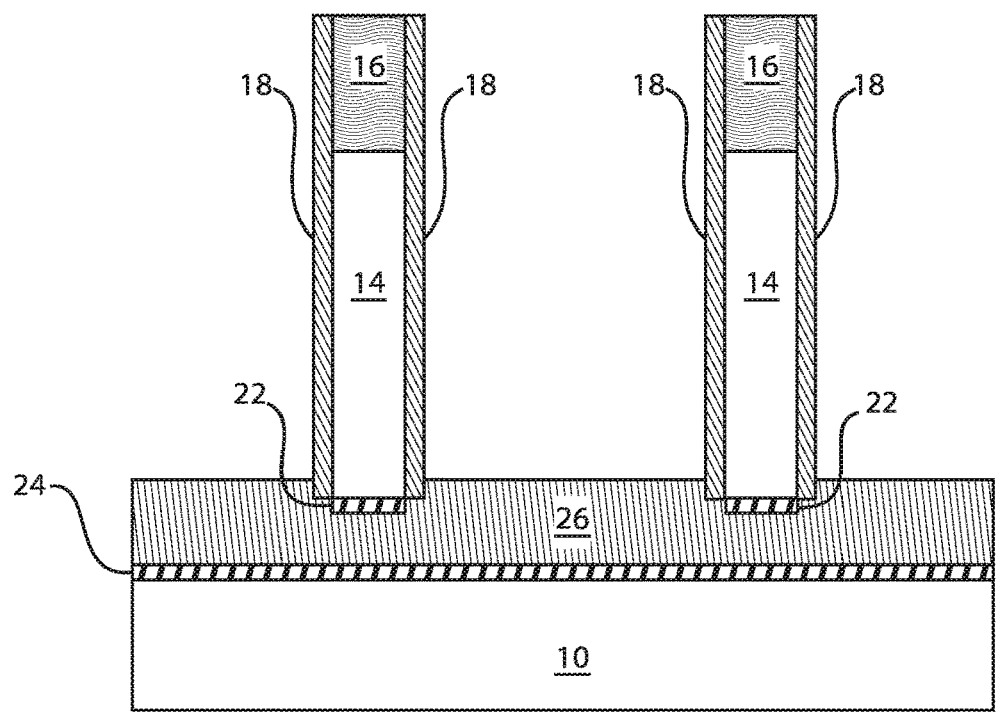
FIG. 4 is a cross-sectional view of the semiconductor structure of FIG. 3 where an embedded bottom source/drain region is formed, in accordance with an embodiment of the present invention.

FIGS. 2-4 depict processing of the upper half of the fins 14. Top view 7' of structure 5 is illustrated and depicts the plurality of fins 14. In particular, the top view 7' shows the hardmask 16 of the fins 14 encompassed by the liners 18. Additionally, the sacrificial SiGe layer 12 is shown. A first axis A-A' extends through an upper half of the fins 14, whereas a second axis B-B' extends through a lower half of the fins 14. However, a block mask 21 is deposited on the lower half of the fins 14. Thus, only the upper half of the fins 14 are processed first. After the upper half of the fins 14 are processed, then a block mask is applied to the upper half of the fins 14 in order to process the lower half of the fins 14. The processing of the lower half of the fins 14 is similar to the processing of the upper half of the fins 14, and, thus, a detailed description of such processing is omitted. However, the basic steps remain the same, that is, removal of the SiGe sacrificial layer, formation of the etch stop layer, formation of the embedded bottom source/drain region, and self-aligned etching to eliminate the non-uniformity of the embedded bottom source/drain region. The block mask 21 is then removed from the upper half of the fins 14. Therefore, the structure of FIG. 5 below is the resultant structure for both the lower half of the fins 14 and the upper half of the fins 14. In other words, each fin 14 is essentially split in half (post fin cut). One of the halves is blocked off while the opposing half undergoes the bottom sacrificial layer removal and embedded epi growth. Then, that half is blocked off and the process is repeated. This permits the formation of embedded bottom epi along the entire fin length without requiring additional margin outside of the fin to form a dually clamped beam. Thus, a selective SiGe removal process is employed to form bottom epi under the active fin bottom.

FIG. 3 is a cross-sectional view of the semiconductor structure of FIG. 2 where an etch stop layer is grown, in accordance with an embodiment of the present invention.

In various exemplary embodiments, etch stop layers 22, 24 are grown. First etch stop layers 22 are formed directly underneath the fins 14. Second etch stop layer 24 is formed on an upper surface of the substrate 10. The second etch stop layer 24 extends over an entire upper surface of the substrate 10.

In one example, etch stop layers 22, 24 include silicon germanium (SiGe) epitaxially grown on substrate 10 and the bottom portion of fins 14. In this case, SiGe acts as an etch stop layer. Where SiGe is employed, it can include, for example, approximately 20% germanium (Ge), but other concentrations are also possible. In one example, the SiGe etch stop layers 22, 24 are p-doped. In addition, materials other than SiGe capable of stopping an etch can be employed. Etch stop layers 22, 24 can have a thickness of, for example, approximately 2 nm to approximately 4 nm. However, the exemplary embodiments of the present invention are not limited to those thicknesses.

FIG. 4 is a cross-sectional view of the semiconductor structure of FIG. 3 where an embedded bottom source/drain region is formed, in accordance with an embodiment of the present invention.

In various exemplary embodiments, an embedded bottom source/drain region 26 is formed between the etch stop layers 22, 24. The embedded bottom source/drain region 26 can be referred to as an embedded stressor or embedded stressor material or embedded stressor region or highly doped bottom epi or epitaxially grown region. By "highly doped" is meant a dopant concentration (p-type or n-type) that is greater than $1 \cdot 10^{19}$ atoms/cm$^3$, with a dopant concentration of greater than $1 \cdot 10^{20}$ atoms/cm$^3$ being more typical.

The embedded stressor 26 functions to apply a desired tensile or compressive stress to the channel of the completed FET device. In an embodiment, the embedded stressor 26, when deposited in what will be a pFET region, can include Si:Ge material at a Ge percentage ratio of 20-80%, with 30-60% being typical. In an embodiment, the embedded stressor 26, when deposited in what will be an nFET region, can include Si:C material (carbon-doped silicon).

In general, the crystalline semiconductor layer of the embedded stressor 26 can be doped (e.g., in situ doped) or un-doped and can include: silicon, germanium, a silicon-germanium alloy and/or carbon doped silicon (Si:C). In one embodiment, the crystalline semiconductor layer of the embedded stressor 26 can include carbon doped silicon with an atomic carbon concentration of between about 0.2% to about 4.0% substitutional carbon. In one embodiment, the crystalline semiconductor layer of the embedded stressor 26 can include a carbon doped silicon type material having a concentration of about 0.3% to about 2.5% substitutional carbon. It is understood that the total amount of carbon in the crystalline semiconductor layer of the embedded stressor 26 can be higher than the substitutional amount. In an exemplary embodiment, the crystalline semiconductor layer of the embedded stressor 26 can include silicon, germanium, silicon germanium, carbon doped silicon, a silicon-germanium alloy, and compound (e.g. III-V and II-VI) semiconductor materials, etc.

The material used for the embedded stressor 26 can have a lattice constant that is different than the lattice constant of the semiconductor substrate 10. For example, when the semiconductor substrate 10 includes silicon, the embedded stressor 26 can be, for example, silicon germanium (SiGe), silicon carbon (Si:C), silicon germanium carbon (SiGeC). When a pFET is to be formed on the semiconductor substrate 10, the embedded stressor 26 can include SiGe. When an nFET is to be formed on a semiconductor substrate, the embedded stressor 26 can include Si:C.

Usually, the embedded stressor 26 and the underlying or bulk semiconductor region 10 on which it is disposed and of which the fins 14 are provided includes monocrystalline semiconductor material. For example, the underlying or bulk semiconductor region 10 can be made of monocrystalline semiconductor material such as a bulk semiconductor region of a monocrystalline semiconductor substrate, e.g., a silicon substrate. The embedded stressor 26 and the underlying semiconductor region 10 can be made of, or can include a monocrystalline semiconductor material such as silicon (Si) or germanium (Ge). In one example, the embedded stressor 26 can be formed by deposition onto the underlying semiconductor region 10. The embedded stressor 26 can be epitaxially grown from an exposed surface of the underlying semiconductor region 10. In one example, the underlying semiconductor region 10 can include silicon and the embedded stressor 26 can include a semiconductor alloy of silicon with another semiconductor such as germanium or carbon. In another example, the underlying semiconductor region 10 can include a semiconductor alloy material including silicon and the embedded stressor 26 can include a semiconductor material such as silicon. In yet another example, both the underlying semiconductor region 10 and the embedded stressor 26 can include a semiconductor alloy material including silicon but the percentages of the alloying material, e.g., the percentage of Ge or carbon (C) in the semiconductor alloy, in the underlying semiconductor region 10 and in the embedded stressor 26 can vary.

The embedded stressor material region 26 can be formed such that it substantially overfills the etch stop regions 22, 24 wherein the embedded stressor material region 26 extends above the entire upper surface of the etch stop layer 24. In other words, the embedded stressor material region 26 does not need to be aligned with the bottom of the fins 14 at this point of processing.

Figure 5:
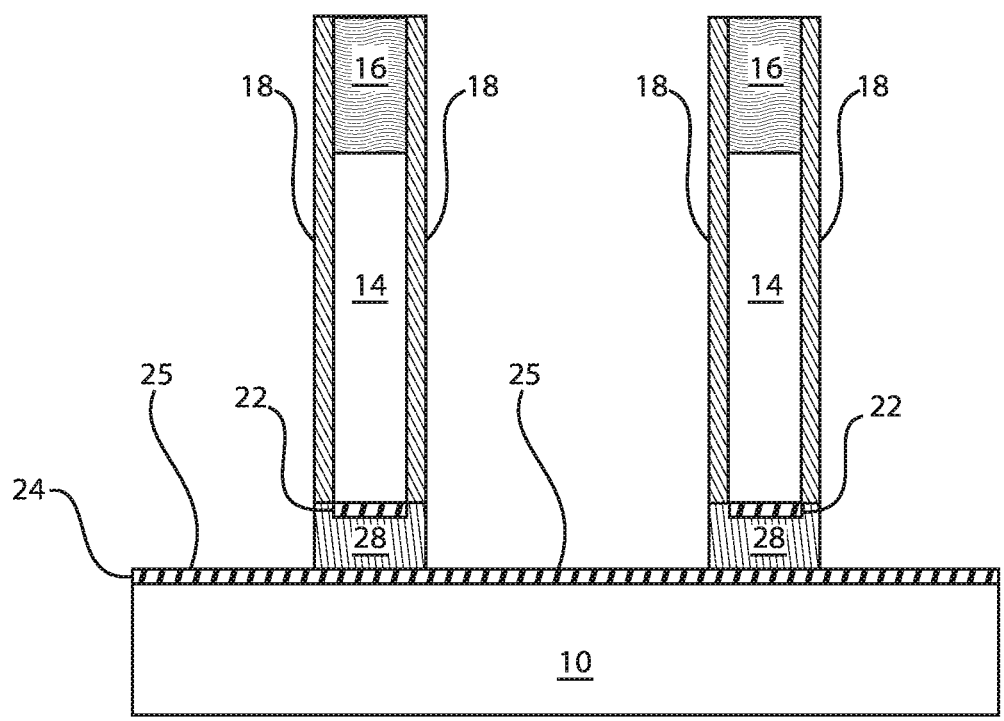
FIG. 5 is a cross-sectional view of the semiconductor structure of FIG. 4 where self-aligned etching is performed to eliminate non-uniformity of the embedded source/drain region, in accordance with an embodiment of the present invention.

FIG. 5 is a cross-sectional view of the semiconductor structure of FIG. 4 where self-aligned etching is performed to eliminate non-uniformity of the embedded source/drain region, in accordance with an embodiment of the present invention.

In various exemplary embodiments, the overfill epi is removed to expose a top surface 25 of the etch stop layer 24. Self-aligned directional RIE can be employed to remove the overfill bottom source/drain epi. Note that the non-uniformity of embedded epi due to the overlay issue of upper/lower half of the fins is now a non-issue. P-doped SiGe layer can act as an etch stop during self-aligned directional RIE. The removal of the overfill epi results in the formation of embedded source/drain regions 28 directly underneath the fins 14. The embedded source/drain regions 28 are aligned with the fins 14. The embedded source/drain regions 28 are also aligned with the etch stop layers 22 formed directly underneath the fins 14. Stated differently, self-aligned highly doped bottom epi regions 28 are formed in vertical FETs.

Figure 6:
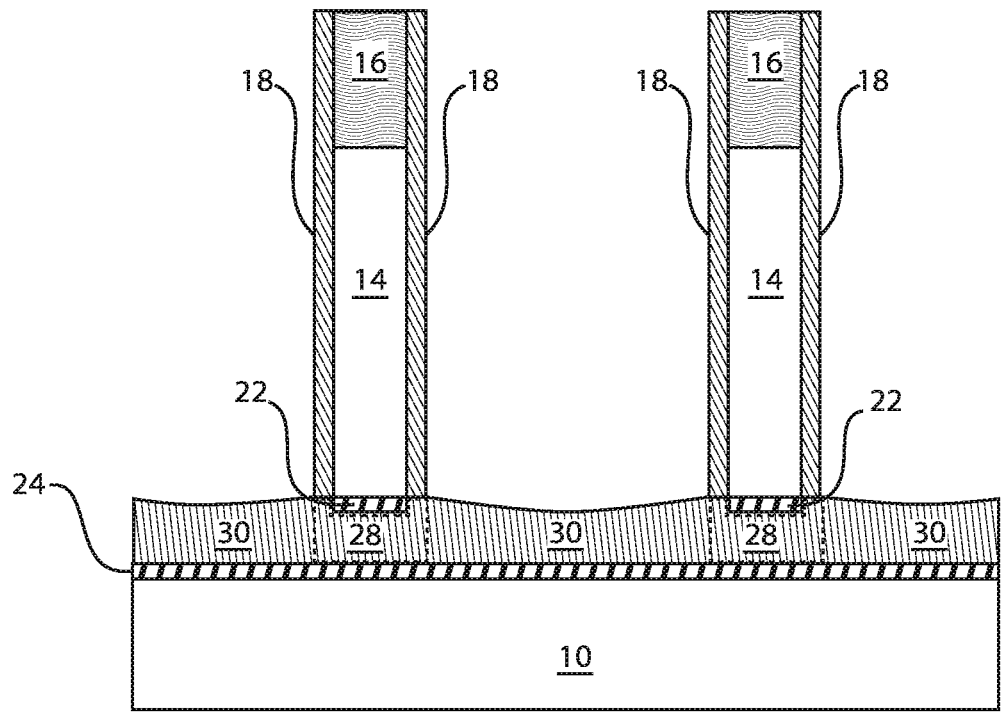
FIG. 6 is a cross-sectional view of the semiconductor structure of FIG. 5 where a bottom source/drain region is formed, in accordance with an embodiment of the present invention.

FIG. 6 is a cross-sectional view of the semiconductor structure of FIG. 5 where a bottom source/drain region is formed, in accordance with an embodiment of the present invention.

In various exemplary embodiments, bottom source/drain region 30 can be epitaxially grown over the etch stop layer 24. Source/drain region 30 can be, e.g., Si:P for an nFET and SiGe:B for a pFET. It is to be understood that the term "source/drain region" as used herein means that a given source/drain region can be either a source region or a drain region, depending on the application.

The terms "epitaxial growth" and "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

Figure 7:
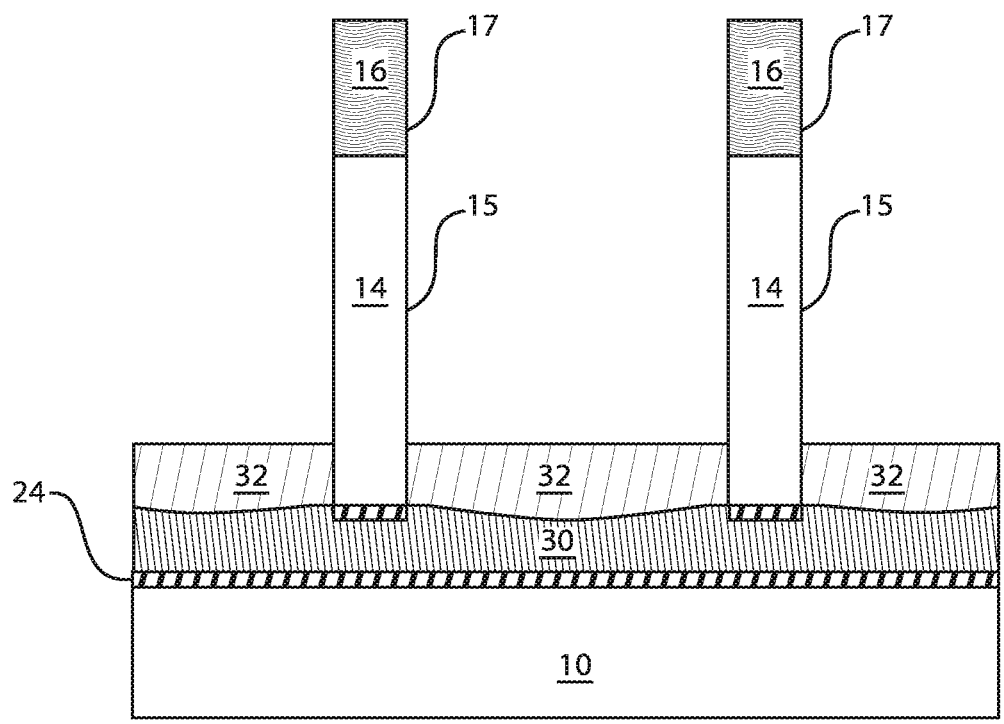
FIG. 7 is a cross-sectional view of the semiconductor structure of FIG. 6 where a bottom spacer is formed, in accordance with an embodiment of the present invention.

FIG. 7 is a cross-sectional view of the semiconductor structure of FIG. 6 where a bottom spacer is formed, in accordance with an embodiment of the present invention.

In various exemplary embodiments, the liners 18 are removed and bottom spacers 32 are formed over the bottom source/drain region 30. The removal of liners 18 results in the exposure of sidewalls 15 of the fins 14 and sidewalls 17 of the hardmask 16. Bottom spacers 32 can include a low-k dielectric formed according to known processes. The term "low-k dielectric" generally refers to an insulating material having a dielectric constant less than silicon dioxide, e.g., less than 3.9. Exemplary low-k dielectric materials include, but are not limited to, dielectric nitrides (e.g., SiN, SiBCN), dielectric oxynitrides (e.g., SiOCN, SiCO), or any combination thereof or the like.

Figure 8:
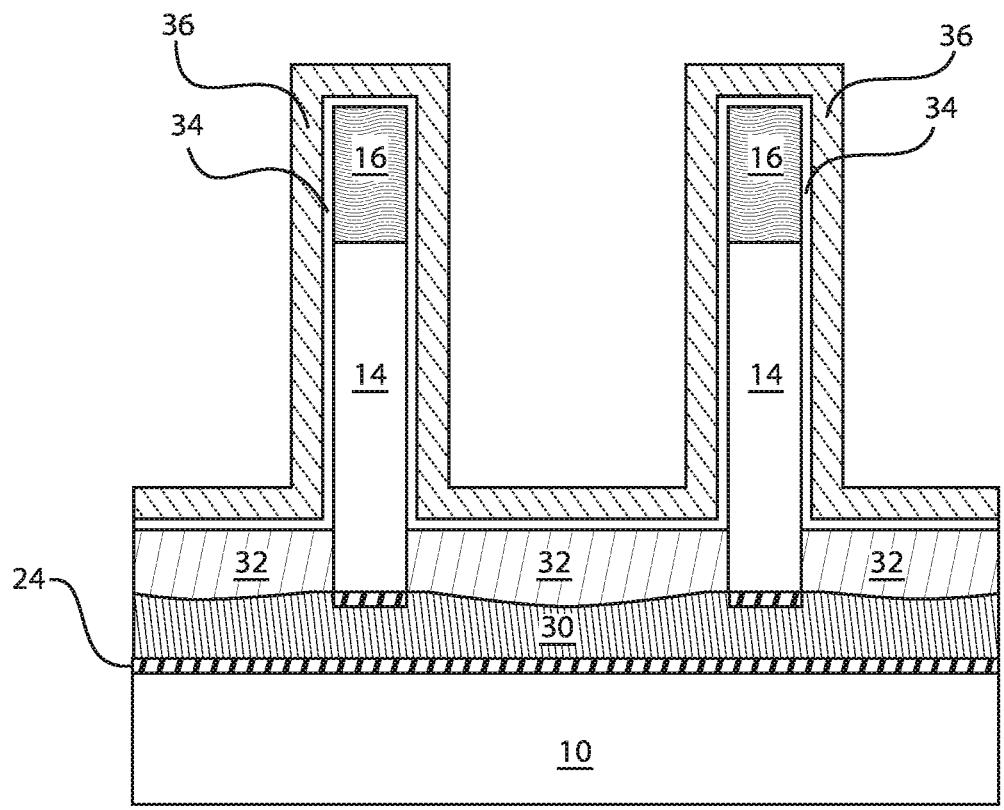
FIG. 8 is a cross-sectional view of the semiconductor structure of FIG. 7 where a high-k metal gate (or WFM) is formed, in accordance with an embodiment of the present invention.

FIG. 8 is a cross-sectional view of the semiconductor structure of FIG. 7 where a high-k metal gate (or WFM) is formed, in accordance with an embodiment of the present invention.

In various exemplary embodiments, a high-k layer 34 and a work function metal layer 36 are deposited. The high-k layer 34 can include a hafnium oxide (HfO$_2$) layer deposited to a thickness of approximately 2 nm. High-k layer 34 can be formed using ALD, which involves the deposition of successive monolayers over a substrate within a deposition chamber usually maintained at sub-atmospheric pressure. Furthermore, it will be appreciated that "high-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, HfO$_2$, ZrO$_2$, Al$_2$O$_3$, TiO$_2$, Ta$_2$O$_5$, lanthanide oxides and mixtures thereof, silicates and materials such as YSZ (yttria-stabilized zirconia).

WFM layer 36 can be selectively grown over high-k layer 34 and can include aluminum (Al) or an aluminum/titanium (Al/Ti) multilayer stack, where the Al/Ti thickness can be tuned for target composition ratio to achieve the desired work function. Both Al and Ti could be selectively grown. In other exemplary embodiments, the WFM layer 36 can be, e.g., TiN, TiAlC, TaN, etc.

Therefore, a high-k material 34 can be formed on the intermediate structure, followed by formation of a work function metal (WFM) layer 36 according to one polarity device (for example nFET or pFET) on the wafer and according to another polarity device (for example nFET or pFET). It is appreciated that an nFET uses one type of WFM and a pFET uses another type of WFM. In one example, the WFM layer 36 can be TiN for a pFET, and the WFM layer 36 can be Al-doped TiN or TaN, etc., for an nFET.

Figure 9:
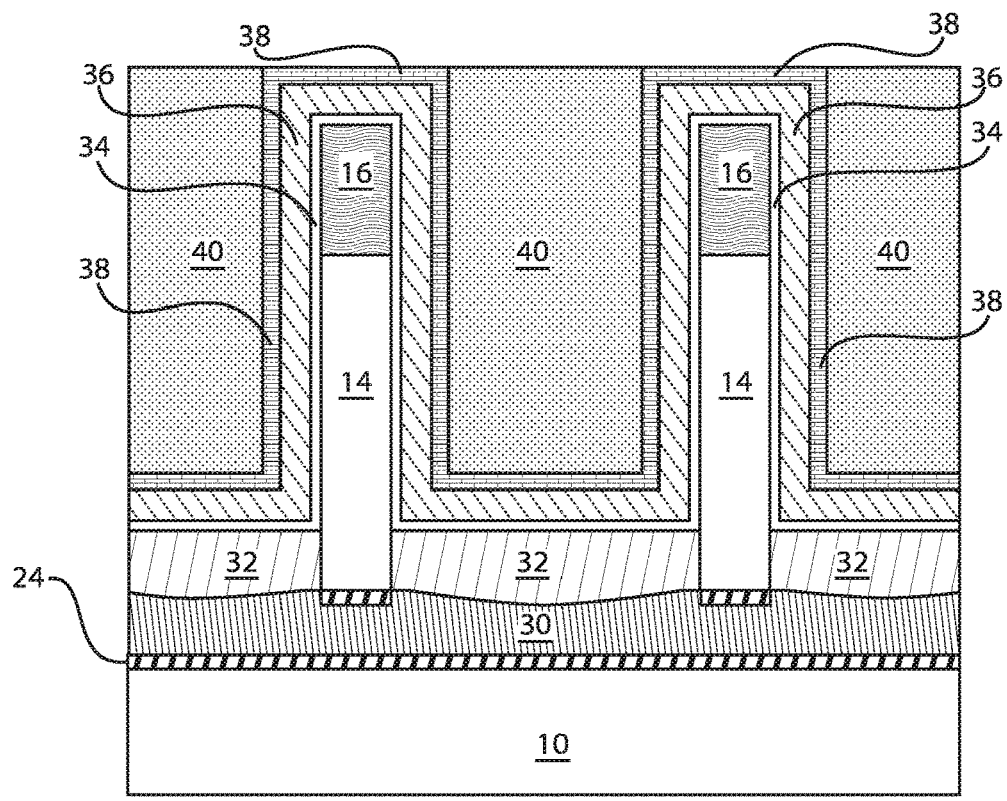
FIG. 9 is a cross-sectional view of the semiconductor structure of FIG. 8 where gate encapsulation takes place, in accordance with an embodiment of the present invention.

FIG. 9 is a cross-sectional view of the semiconductor structure of FIG. 8 where gate encapsulation takes place, in accordance with an embodiment of the present invention.

In various exemplary embodiments, gate encapsulation can occur. Gate encapsulation can include deposition of a first gate encapsulation layer 38 and a second gate encapsulation layer 40. The first gate encapsulation layer 38 can be a nitride, such as, e.g., SiN or SiBCN. The second gate encapsulation layer 40 can be an oxide, such as, e.g., SiO$_2$.

The second gate encapsulation layer 40 can be planarized. The planarizing process can include chemical mechanical polishing (CMP) followed by an etch process. Thus, the planarization process can be provided by CMP. Other planarization processes can include grinding and polishing.

Figure 10:
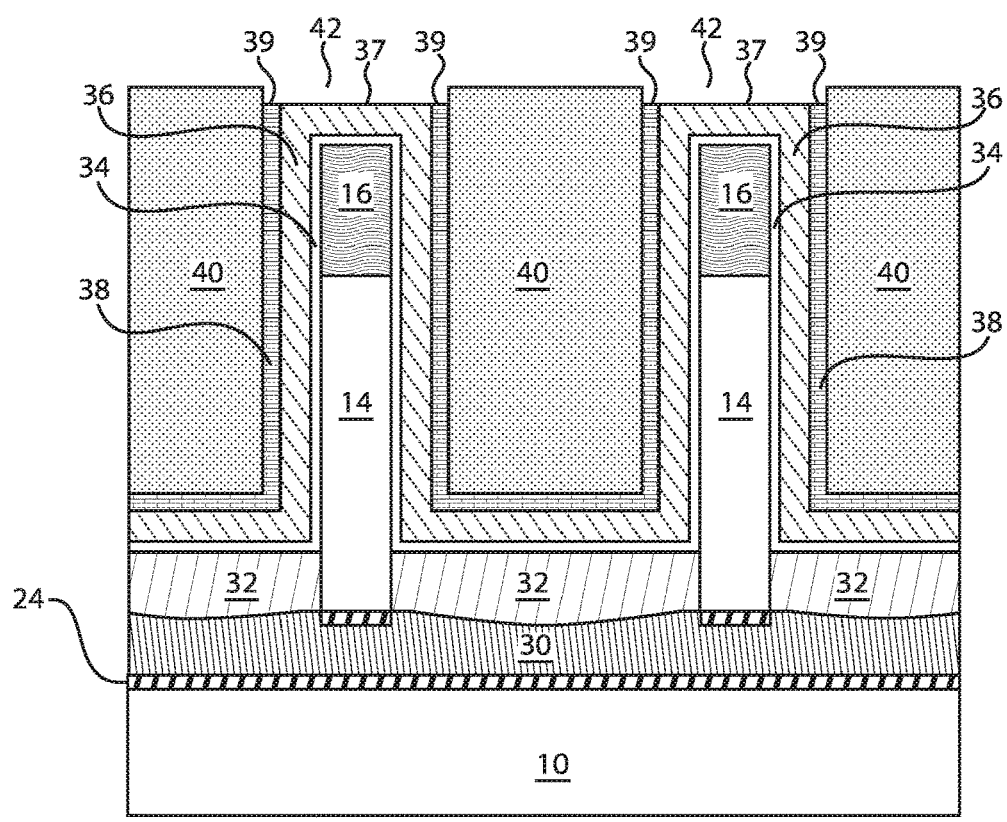
FIG. 10 is a cross-sectional view of the semiconductor structure of FIG. 9 where at least one gate encapsulation layer is recessed to expose a top surface of the metal gate, in accordance with an embodiment of the present invention.

FIG. 10 is a cross-sectional view of the semiconductor structure of FIG. 9 where at least one gate encapsulation layer is recessed to expose a top surface of the metal gate, in accordance with an embodiment of the present invention.

In various exemplary embodiments, first gate encapsulation layer 38 is etched or recessed, e.g., by selective RIE, to create openings or trenches 42 to expose a top surface 37 of the WFM layer 36. Additionally, a top surface 39 of the first gate encapsulation layer 38 on the sidewalls of the WFM layer 36 is exposed.

Figure 11:
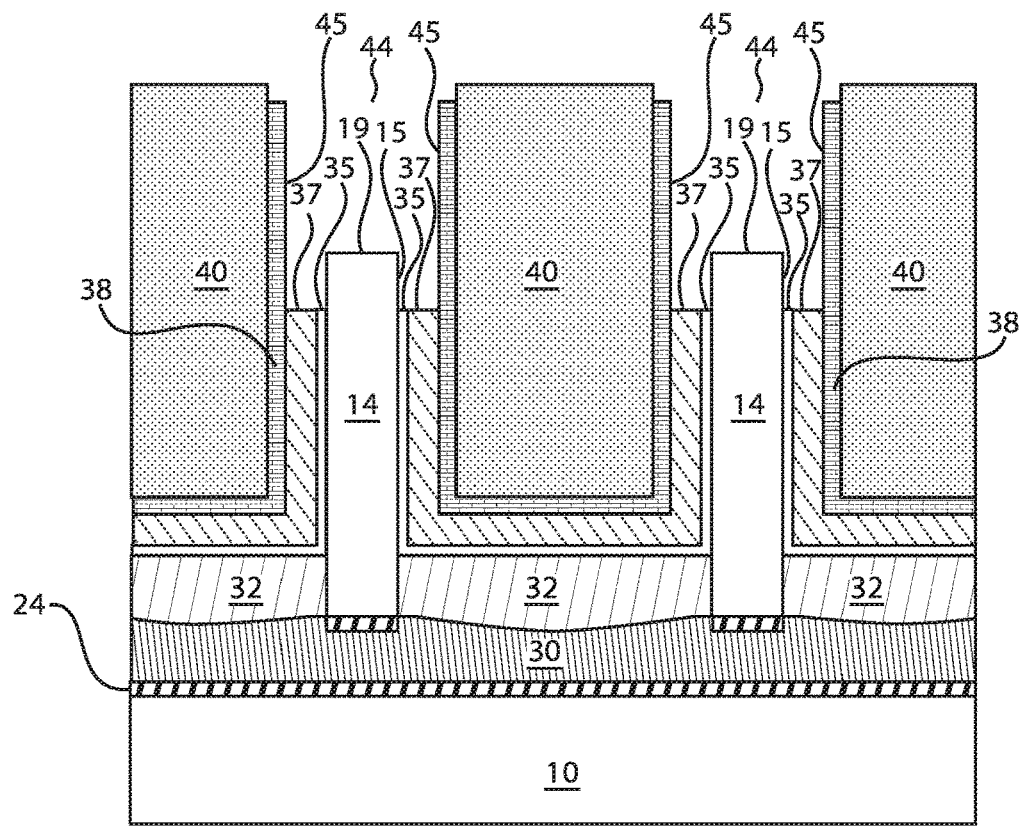
FIG. 11 is a cross-sectional view of the semiconductor structure of FIG. 10 where the high-k metal gate is recessed to expose top portions of the plurality of fins, in accordance with an embodiment of the present invention.

FIG. 11 is a cross-sectional view of the semiconductor structure of FIG. 10 where the high-k metal gate is recessed to expose top portions of the plurality of fins, in accordance with an embodiment of the present invention.

In various exemplary embodiments, the high-k material 34 and the WFM layer 36, are etched back until they are recessed below the height of the fins 14 in the z-axis. Recessing the layers 34, 36 can be performed by employing wet etch techniques, and results in trenches 44. In one example, a vertical wet etch can be employed to define the channel length. Non-limiting examples of wet etch processes that can be used to form the recess include potassium hydroxide (KOH), ammonium hydroxide (ammonia), tetramethylammonium hydroxide (TMAH), hydrazine, or ethylene diamine pyrocatechol (EDP), or any combination thereof.

The etch back results in exposure of a top surface 19 of the fins 14, as well as sidewalls 15 of the fins 14. Additionally, a top surface 37 of the WFM layer 36 and a top surface 35 of the high-k material 34 are exposed. The sidewalls 45 of the first gate encapsulation layer 38 are also exposed. In one example, the width of the trenches 44 can be about 30 nm, whereas the width of the high-k material 34 and the WFM layer 36 combined can be about 10 nm.

Figure 12:
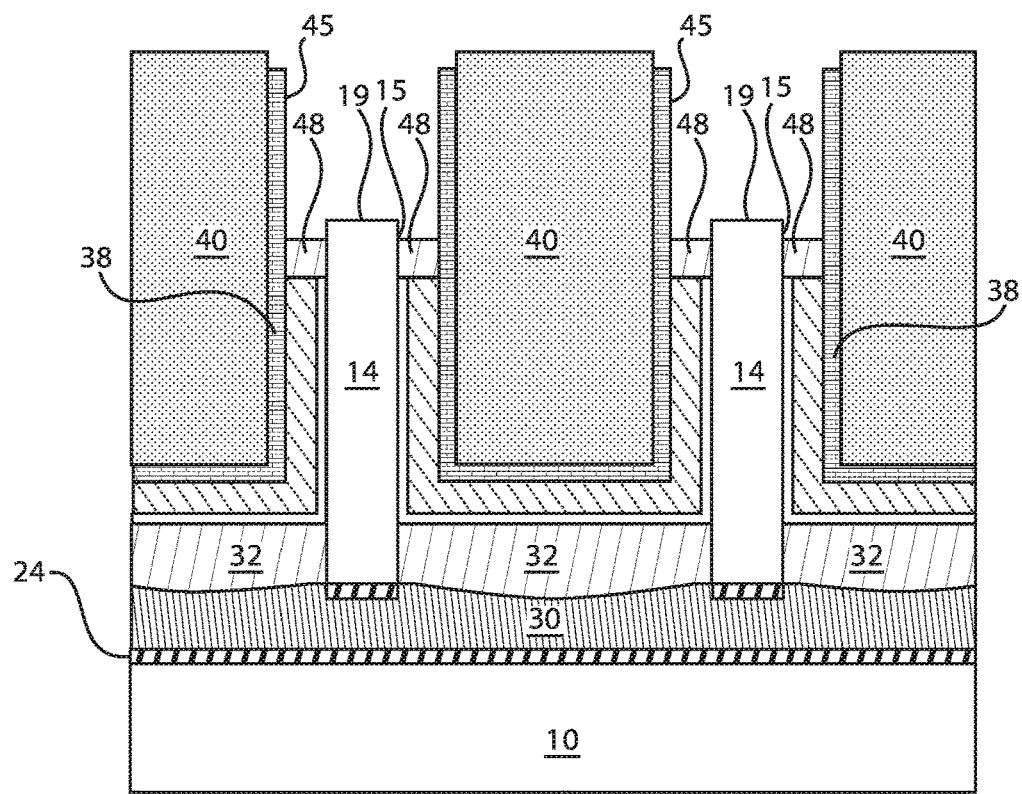
FIG. 12 is a cross-sectional view of the semiconductor structure of FIG. 11 where a top spacer is deposited adjacent the top portions of the plurality of fins, in accordance with an embodiment of the present invention.

FIG. 12 is a cross-sectional view of the semiconductor structure of FIG. 11 where a top spacer is deposited adjacent the top portions of the plurality of fins, in accordance with an embodiment of the present invention.

In various exemplary embodiments, top spacers 48 are formed. Top spacer material 48 can be formed over the top surfaces 35, 37 of the high-k material 34 and the WFM layer 36, respectively. The top spacers 48 allow for a portion of the sidewalls 15 of the fins 14 to be exposed. Additionally, a top surface 19 of the spacers 14 further remains exposed. Examples of top spacer material 48 can include oxides and nitrides (such as, e.g., SiN, SiBCN, SiOCN). The top spacer material 48 can be a low-k dielectric material. In one implementation, the top spacer material 48 can be formed with techniques analogous to forming the bottom spacer material 32. The top spacer material 48 can be thicker than the bottom spacer material 32.

Figure 13:
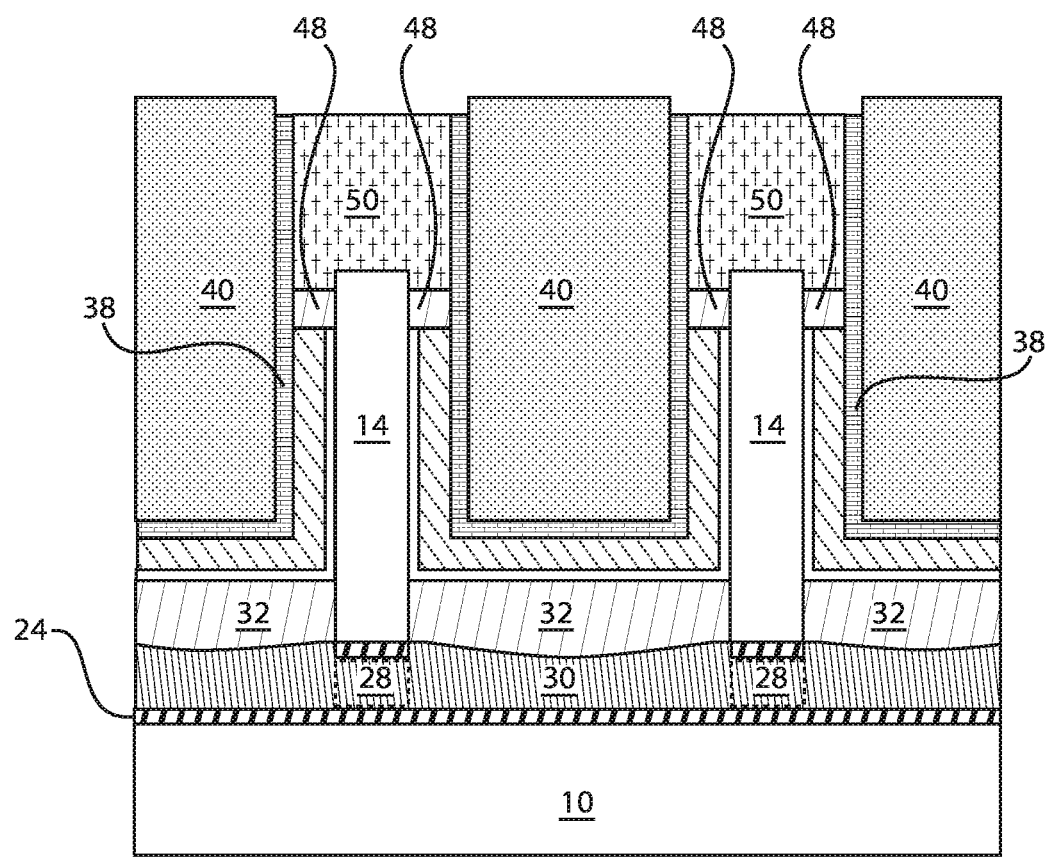
FIG. 13 is a cross-sectional view of the semiconductor structure of FIG. 12 where top source/drain regions are formed over the top portions of the plurality of fins, in accordance with an embodiment of the present invention.

FIG. 13 is a cross-sectional view of the semiconductor structure of FIG. 12 where top source/drain regions are formed over the top portions of the plurality of fins, in accordance with an embodiment of the present invention.

In various exemplary embodiments, top source/drain regions 50 are formed over the exposed top fin portions. Therefore, the exemplary embodiments of the present invention provide for a method and structure having self-aligned highly doped bottom epi in vertical transport FETs, which resolves external resistance issues at the bottom source/drain region. The method and structure of self-aligned bottom epi formation provides a way to achieve low resistance at the fin bottom without any thermal budget limitation.

Generally, the subject matter of the present disclosure is directed to various methods for forming embedded stressor material regions in the active areas of NMOS and PMOS devices, as well as the associated structures resulting therefrom. In certain illustrative embodiments, the embedded stressor material regions of an illustrative NMOS device can be formed by epitaxially depositing a stressed semiconductor material, such as silicon-carbon (Si:C), whereas in other embodiments, the embedded stressor regions of an illustrative PMOS device can be formed from an epitaxially deposited stressed silicon-germanium (SiGe) semiconductor material.

Regarding FIGS. 1-19, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties can include doping, such as doping transistor sources and drains, generally by diffusion and/or by ion implantation. These doping processes are followed by furnace annealing or by rapid thermal annealing (RTA). Annealing serves to activate the implanted dopants.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for reducing external resistance by employing an embedded bottom source/drain for vertical transport FETs (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for reducing external resistance of a vertical field-effect-transistor (FET), the method comprising:
   forming a plurality of fins over a sacrificial layer formed over a substrate;
   selectively removing the sacrificial layer to form an etch stop layer in direct contact with the substrate;
   disposing embedded bottom source/drain regions between a bottom portion of the plurality of fins and the etch stop layer;
   disposing encapsulation layers over the plurality of fins;
   recessing at least one of the encapsulation layers to expose top portions of the plurality of fins;
   forming top spacers adjacent the top portions of the plurality of fins; and
   forming top source/drain regions in direct contact with an entirety of all upper surfaces of the top spacers.

2. The method of claim 1, further comprising depositing a high-k layer and a work function metal (WFM) layer over the plurality of fins before disposing the encapsulation layers.

3. The method of claim 2, further comprising forming a bottom spacer over the bottom source/drain region before deposition of the high-k layer and the WFM layer.

4. The method of claim 1, wherein the encapsulation layers include a first encapsulation layer and a second encapsulation layer.

5. The method of claim 1, wherein an upper half of the plurality of fins are processed separately from a lower half of the plurality of fins.

6. The method of claim 1, wherein the etch stop layer extends a length of the substrate and directly contacts the embedded bottom source/drain regions.

7. The method of claim 1, wherein the etch stop layer directly contacts the bottom portion of the plurality of fins.

8. The method of claim 1, wherein the etch stop layer is a p-doped silicon germanium (SiGe) layer having a thickness of 2-4 nanometers.

9. A method for reducing external resistance of a vertical field-effect-transistor (FET), the method comprising:
   forming a plurality of fins over a sacrificial layer formed over a substrate;
   selectively removing the sacrificial layer such that an upper half of the plurality of fins are processed separately from a lower half of the plurality of fins;
   forming a first etch stop layer in direct contact with a bottom portion of the plurality of fins;
   forming a second etch stop layer in direct contact with an entire upper surface of the substrate; and
   disposing embedded bottom source/drain regions directly between the first and second etch stop layers.

10. The method of claim 9, further comprising disposing encapsulation layers over the plurality of fins.

11. The method of claim 10, further comprising recessing at least one of the encapsulation layers to expose top portions of the plurality of fins.

12. The method of claim 11, further comprising forming top spacers adjacent the top portions of the plurality of fins.

13. The method of claim 12, further comprising forming top source/drain regions in direct contact with an entire upper surface of the top spacers.

14. The method of claim 13, wherein the encapsulation layers include a first encapsulation layer and a second encapsulation layer.

15. The method of claim 14, wherein the first encapsulation layer includes silicon nitride (SiN) and the second encapsulation layer includes silicon oxide ($SiO_2$).

16. The method of claim 15, wherein the top spacer directly contacts sidewalls of the first encapsulation layer.

17. The method of claim 9, wherein the first and second etch stop layers include p-doped silicon germanium (SiGe) having a thickness of 2-4 nanometers.

* * * * *